(12) United States Patent
Raghavan et al.

(10) Patent No.: US 9,481,937 B2
(45) Date of Patent: Nov. 1, 2016

(54) SELECTIVE ETCHING OF REACTOR SURFACES

(75) Inventors: Srini Raghavan, Tucson, AZ (US); Eric Shero, Phoenix, AZ (US); Mohith Verghese, Phoenix, AZ (US)

(73) Assignee: ASM America, Inc., Phoenix, AZ (US)

( * ) Notice: Subject to any disclaimer, the term of this patent is extended or adjusted under 35 U.S.C. 154(b) by 2076 days.

(21) Appl. No.: 12/433,579

(22) Filed: Apr. 30, 2009

(65) Prior Publication Data
US 2010/0275952 A1     Nov. 4, 2010

(51) Int. Cl.
| | | |
|---|---|---|
| C09K 13/02 | (2006.01) | |
| C23G 1/22 | (2006.01) | |
| C11D 7/06 | (2006.01) | |
| C11D 7/10 | (2006.01) | |
| C11D 7/26 | (2006.01) | |
| C11D 11/00 | (2006.01) | |
| C23C 16/44 | (2006.01) | |
| C23G 1/18 | (2006.01) | |
| C23G 1/20 | (2006.01) | |

(52) U.S. Cl.
CPC ............... *C23G 1/22* (2013.01); *C09K 13/02* (2013.01); *C11D 7/06* (2013.01); *C11D 7/10* (2013.01); *C11D 7/265* (2013.01); *C11D 11/0041* (2013.01); *C23C 16/4407* (2013.01); *C23G 1/18* (2013.01); *C23G 1/205* (2013.01)

(58) Field of Classification Search
CPC ............. C23C 16/4407; C09K 13/02; C11D 11/0041; C11D 7/06; C11D 7/10; C11D 7/265; C23G 1/18; C23G 1/205; C23G 1/22
USPC .............................. 134/2, 3, 26, 29; 252/79.5
See application file for complete search history.

(56) References Cited

U.S. PATENT DOCUMENTS

| | | | | |
|---|---|---|---|---|
| 2,975,081 A | * | 3/1961 | Kirby, Jr. ............. | C25D 11/243 148/244 |
| 3,285,836 A | * | 11/1966 | Maissel et al. ................ 205/118 | |
| 3,308,065 A | * | 3/1967 | Lesinski ......................... 134/42 | |
| 5,876,614 A | * | 3/1999 | Zhou ................. | H01L 21/31111 216/101 |
| 5,928,430 A | * | 7/1999 | Ward et al. ..................... 134/1.3 | |
| 6,071,573 A | | 6/2000 | Koemtzopoulos et al. | |
| 6,248,704 B1 | | 6/2001 | Small et al. | |
| 6,454,870 B1 | * | 9/2002 | Brooks ...................... | C23C 4/02 134/19 |

(Continued)

FOREIGN PATENT DOCUMENTS

| | | |
|---|---|---|
| CN | 1715389 A | 1/2006 |
| JP | 2003-193276 | 7/2003 |
| TW | 200502427 | 1/2005 |
| WO | WO 2005/068681 A2 | 7/2005 |
| WO | WO 2008-138881 | 11/2008 |

OTHER PUBLICATIONS

Kubo et al., *Molecular Design of Antibrowning Agents*, J. Agric. Food Chem. 2000, vol. 48, pp. 1393-1399.

(Continued)

Primary Examiner — Michael Kornakov
Assistant Examiner — Katelyn Whatley
(74) Attorney, Agent, or Firm — Knobbe, Martens, Olson & Bear LLP

(57) ABSTRACT

Compositions, methods, and systems permit selectively etching metal oxide from reactor metal parts (e.g., titanium and/or titanium alloys). The etching composition comprises an alkali metal hydroxide and gallic acid. The method is useful for cleaning reaction chambers used in the deposition of metal oxide films such as aluminum oxide.

17 Claims, 19 Drawing Sheets

(56) References Cited

U.S. PATENT DOCUMENTS

| | | | |
|---|---|---|---|
| 6,890,596 B2 | 5/2005 | Sarigainnis et al. | |
| 7,790,624 B2 | 9/2010 | Sharma | |
| 7,939,447 B2 | 5/2011 | Bauer et al. | |
| 2004/0221807 A1* | 11/2004 | Verghese et al. | 118/715 |
| 2005/0241679 A1 | 11/2005 | Rauch et al. | |
| 2005/0274396 A1* | 12/2005 | Shih | H01J 37/32862 134/29 |
| 2006/0014656 A1* | 1/2006 | Egbe | C11D 7/10 510/175 |
| 2009/0111246 A1 | 4/2009 | Bauer et al. | |
| 2009/0176685 A1* | 7/2009 | Ward | 510/402 |
| 2009/0215658 A1* | 8/2009 | Minsek | C09G 1/02 510/175 |
| 2010/0261632 A1* | 10/2010 | Korzenski et al. | 510/175 |

OTHER PUBLICATIONS

Wuts et al., *Greene's Protective Groups in Organic Synthesis*, John Wiley & Sons, Inc., 2007, Fourth Edition, pp. 272-279, 363-365 and 428-429, Hoboken, New Jersey, USA.

International Search Report mailed Oct. 26, 2010 for International application PCT/US2010/029562.

Office Action dated Aug. 4, 2014 in Taiwanese Patent Application No. 099112156, filed Apr. 19, 2010.

Office Action dated Nov. 19, 2013 in Chinese Patent Application No. 201080013958.4, filed Apr. 1, 2010.

Notice of Non-Final Rejection dated Aug. 1, 2016 in Korea Patent Application No. 2011-7027392.

\* cited by examiner

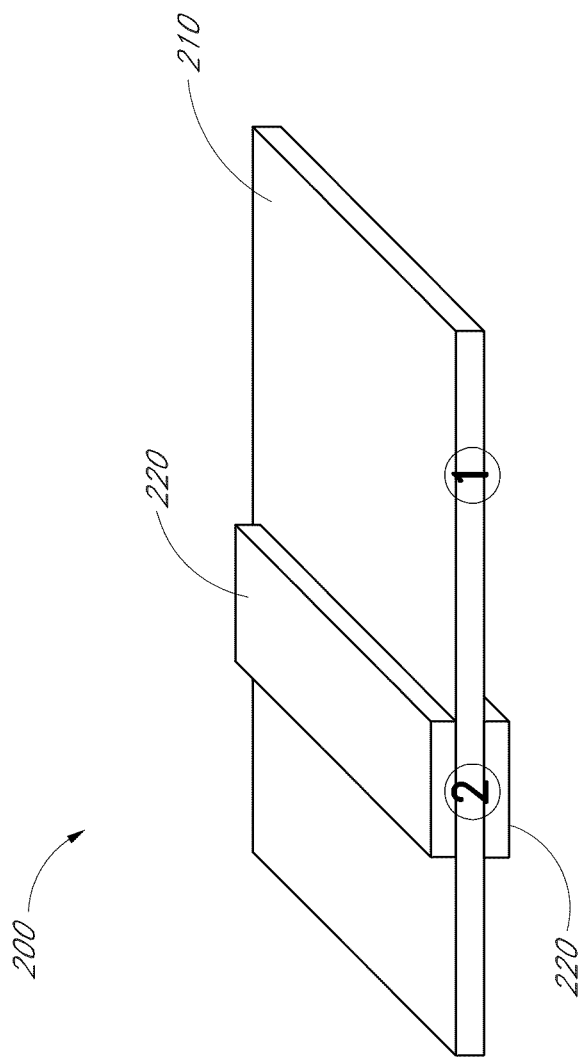

SELECTIVE ETCHING OF REACTOR SURFACES

BACKGROUND

1. Technical Field

This application is generally related to thin film manufacturing, and more particularly, to the cleaning of reactors used in depositing thin films.

2. Description of the Related Art

In the manufacture of integrated devices, thin films are deposited or formed on substrates in a reaction chamber or reactor, for example, by chemical vapor deposition (CVD) or atomic layer deposition (ALD). In these deposition processes, the film materials are also deposited on other surfaces, for example, on the walls and other exposed surfaces of the reaction chamber, thereby contaminating these surfaces. Over time, these materials accumulate and build up, eventually flaking, shedding, and/or delaminating particles from the surface of the reaction chamber. Particles that land on a surface of a substrate, for example, either falling on the surface or carried in a gas stream, can cause problems in the manufacturing process, for example, by reducing the yield and/or reproducibility of the process. Periodically cleaning the contaminants from the reaction chamber can reduce these problems.

One method for cleaning a reaction chamber is by in situ etching cycles using one or more cleaning cycles of suitable etchants. In situ cleaning reduces the need to remove, replace, and/or requalify a contaminated reaction chamber. In cases in which the etch rates are high, in situ etching can be performed as often as necessary without significantly affecting the tool's throughput. Lower etch rates can reduce throughput, however. Moreover, in some cases in situ etching exhibits one or more drawbacks, for example, significantly etching one or more components of the reaction chamber, causing substrate contamination, and/or causing environmental, health, and safety (EHS) problems. Consequently, in some cases, in situ cleaning is not feasible.

Another option for cleaning reaction chambers is ex situ cleaning, in which the contaminated components are removed from service for cleaning. "Bead blasting" is a form of ex situ cleaning by mechanical abrasion in which a stream of an abrasive grit, for example, alumina, zirconia, glass, silica, SiC, or other suitable material, is impinged against a surface-to-be-cleaned, for example, using a high-pressure fluid stream. Bead blasting has several shortcomings, for example, damage can be caused to the reaction chamber components by the cleaning process, thereby reducing their lifetimes. Bead blasting is a "line of sight" process, resulting in difficultly in cleaning high aspect ratio components. Due to an inability to visually monitor the removal of the contaminant(s), an endpoint not apparent, such that, when the contaminant is removed and the underlying material is reached; there is a chance of missing a contaminated area. Bead blasting can also cause contamination of the cleaned part by the abrasive material. Contaminants that are as hard or harder than the abrasive material cannot easily be removed by bead blasting. Bead blasting also entails high cost and low reproducibility.

SUMMARY OF THE INVENTION

Compositions, methods, and systems permit selectively etching metal oxides from metal chamber surfaces. The method is useful for cleaning reaction chambers used in the deposition of metal oxide films.

In one embodiment, a method is provided for selectively etching metal oxide from a metal part of a semiconductor reactor. The method includes contacting a surface of a metal part with an alkaline etchant. A metal oxide is present on the surface of the metal part. The alkaline etchant is effective for etching the metal oxide. While the metal part is susceptible to chemical attack by the alkaline etchant, the surface of the metal part is also contacted part with an inhibitor effective for inhibiting chemical attack of the metal part by the alkaline etchant.

In another embodiment, a method is provided for ex situ wet cleaning aluminum oxide from a titanium or titanium alloy surface of a deposition reactor used for depositing aluminum oxide. The method includes contacting with an etchant a titanium or titanium alloy surface of a deposition reactor on which a layer of aluminum oxide is deposited, wherein the etchant comprises at least one of sodium hydroxide and potassium hydroxide. The method further includes contacting the titanium or titanium alloy surface with an inhibitor comprising a polyhydroxy benzene compound. The titanium or titanium alloy surface is also contacted with a stabilizer comprising borate species.

In another embodiment, an etching composition is provided for selectively cleaning metal oxide from metal parts. The composition includes an alkaline etchant in an amount effective to etch metal oxide from over a metal part. The composition also includes an inhibitor in an amount effective to inhibit etching of the metal part by the alkaline etchant.

BRIEF DESCRIPTION OF THE DRAWINGS

FIG. 2 schematically illustrates an embodiment of a test sample useful for evaluating the etching of aluminum oxide from titanium.

DETAILED DESCRIPTION OF SOME PREFERRED EMBODIMENTS

Figure 1:
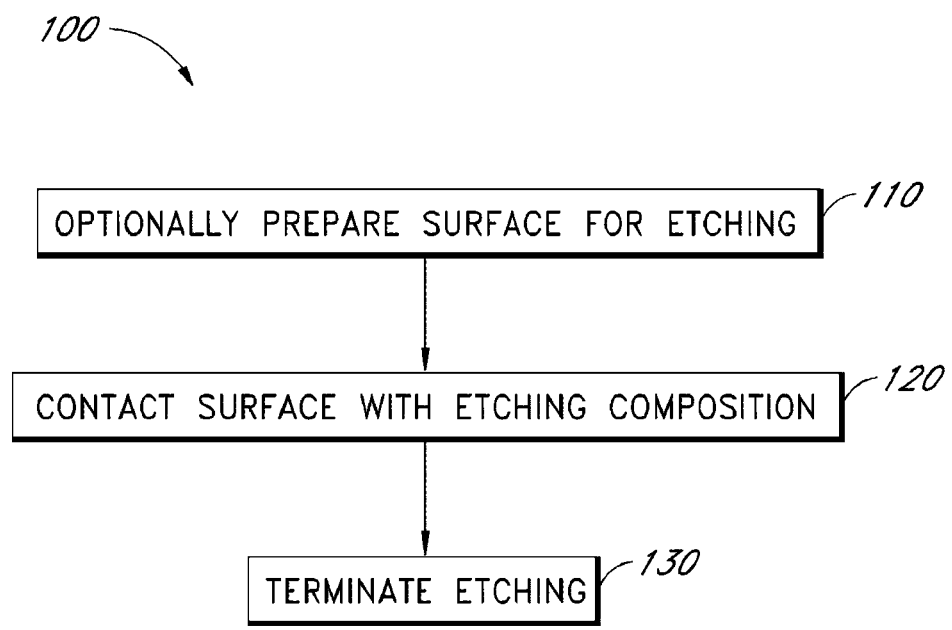
FIG. 1 is a flowchart illustrating an embodiment of a method for selectively etching metal oxide from metal chamber parts.

Described herein is a composition, method, and system for cleaning base-etchable contaminants from metal parts or components of semiconductor reactors, particularly deposition chambers. CVD and/or ALD reaction chambers often comprise titanium and/or titanium alloy components, for example, PULSAR® ALD reaction chambers (ASM International, Bilthoven, the Netherlands). Other susceptible metal surfaces in many deposition chambers include stainless steel (e.g., 316L and 304), nickel and vnickel alloys. For example, ALD deposition of metal oxides such as aluminum oxide (alumina, $Al_2O_3$) in a reaction chamber will also deposit layers of aluminum oxide on portions of the reaction chamber. These layers are often non-uniform, for example, from about 150 nm to thousands of nanometers thick, depending on factors including the location of the surface in the reaction chamber, reaction chamber design, the number of deposition cycles, the number of substrates processed, and other processes performed in the reaction chamber. These films potentially flake, shed, spall, or delaminate to form contaminating particles. In particular, aluminum oxide is difficult to clean from reactor surfaces because it is both extremely hard and resistant to many etch chemistries. Other metal oxides deposited in such ALD or CVD chambers for semiconductor processing include hafnium oxide ($HfO_2$), zirconium oxide ($ZrO_2$) and hafnium zirconium oxide ($Hf_xZr_yO_z$). Removal of such metal oxides can also be difficult without damage to the underlying metal surfaces.

Accordingly, the present disclosure provides methods for periodic removal of deposited metal oxide from reactor walls, typically ex situ after multiple deposition cycles. In addition to metal oxide that is incidentally deposited on deposition chamber parts in the course of depositions on substrates, metal oxide is also used as a protective passivation layer or a lift-off layer on reactor chamber surfaces. Periodically, such layers also need to be removed for refreshing, and the methods described herein can also be employed to remove such passivation or lift-off layers periodically from reactor metal parts (whether for deposition reactors or other reactors).

An etching composition comprises an etchant suitable for etching a selected contaminant and a modifier that increases the etching selectivity between the contaminant and the material of a surface-to-be-cleaned. In a preferred embodiment, the selected contaminant comprises aluminum oxide, the etching composition comprises an aqueous composition comprising a base or alkali, and the surface-to-be-cleaned comprises titanium and/or titanium alloy. In some embodiments, the modifier comprises a compound that inhibits etching of titanium and/or titanium alloy, referred to herein as an "inhibitor." In other embodiments, the contaminant to be removed is hafnium oxide, zirconium oxide or mixtures thereof. The surface-to-be-cleaned can also be stainless steel (e.g., 316L and 304), nickel and/or nickel alloys.

In some embodiments, the base etchant comprises a hydroxide of an alkaline metal, for example, lithium, sodium, potassium, rubidium, cesium, and combinations thereof. In preferred embodiments, the base is sodium hydroxide, potassium hydroxide, or combinations thereof. More preferably, the base is potassium hydroxide. The concentration of the base is from about 0.1 M to about 10 M, preferably, from about 0.2 M to about 5 M, more preferably, from about 0.5 M to about 1 M. In some preferred embodiments, the concentration is about 0.5 M, about 1 M, or about 5 M. Higher base concentrations generally correlate with faster etching of aluminum oxide or other metal oxide. In general, for a given etch rate, higher etchant concentrations will be desirable for etching $ZrO_2$, $HfO_2$, and/or $Hf_xZr_yO_z$ as compared to $Al_2O_3$.

In some preferred embodiments, the modifier that provides high selectivity comprises an inhibitor selected from gallic acid (see Formula 1 below), analogs of gallic acid, salts thereof, other polyhydroxy benzene compounds (e.g., polyphenols, pyrogallol, catechol), combinations thereof, and the like. Those skilled in the art will understand that gallic acid will form a salt of gallate anion under basic conditions. The terms "gallic acid" and "gallate" are both used herein to refer to the species present in the etching composition. Preferably, gallic acid is added from about 1:50 to about 1:1 molar ratio compared with the base, more preferably, from about 1:20 to about 1:5, most preferably, about 1:10.

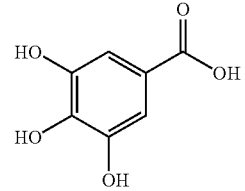

Formula 1

Preferably, the composition further comprises one or more borate anion species, for example, borate ($BO_3^{3-}$), metaborate ($BO_2^-$), tetraborate ($B_4O_7^{2-}$), and the like, which is added by way of any suitable source compound, for example, borate salts, boric acid, borate esters, combinations thereof, and the like. A preferred borate source is borax (sodium tetraborate decahydrate, $Na_2B_4O_7 \cdot 10H_2O$). Those skilled in the art will appreciate that a complex mixture of borate species is formed under basic conditions, for example, borate, diborate, triborate, tetraborate, and higher borates. Accordingly, the term "borate" as used herein refers to all of the borate anions present in a composition. The concentration of borate species is with reference to the quantity of the borate precursor added rather than the actual concentrations of the species in solution. It is believed that borate stabilizes the gallic acid against oxidation. Preferably, the molar ratio of gallic acid to borate is from about 1:10 to about 10:1, more preferably, from about 1:2 to about 2:1, most preferably, about 1:1.

Some embodiments of the etching composition comprise other additives known in the art, for example, surfactants, dispersants, chelating agents, viscosity modifiers, abrasives, combinations thereof, and the like. Suitable surfactants include anionic, cationic, and nonionic surfactants known in the art, for example, sulfonates, ammonium salts, polyethoxylates, combinations, and the like. Suitable dispersants include those derived from ammonia, amines, alkanolamines, bases, combinations and the like, for example, triethanolamine. Surfactants, dispersants, and/or chelating agents can improve cleaning by solubilizing and/or suspending contaminants and etching by-products, as well as providing improved wetting of the surface-to-be-cleaned. Viscosity modifiers, thixotropic agents, and/or rheology modifiers are useful in formulating gels and/or pastes, which permit the etching formulation to cling to non-horizontal surfaces, for example. Abrasives provide a physical cleaning effect suitably activated, for example, by mechanical action, ultrasound, agitation, combinations, or the like.

FIG. 1 is a flowchart illustrating an embodiment of a method 100 for cleaning titanium and/or titanium alloy surfaces contaminated with materials comprising aluminum oxide. As discussed above, the etching composition is also useful for etching zirconium oxide, hafnium oxide or mixtures thereof from stainless steel, nickel or nickel alloys.

In step 110, the surface-to-be-cleaned is optionally prepared for etching. For example, in some embodiments, one or more components of a reaction chamber are disassembled, for example, to provide access to a surface-to-be-cleaned. Some embodiments comprise a precleaning step, for example, to remove lubricants, sealants, and/or greases by any means known in the art. Those skilled in the art will understand that the particular precleaning conditions will depend on the particular material to be removed. Some embodiments include a masking step, for example, to prevent contact of a masked surface with the etching composition.

In step 120 the surface-to-be-cleaned is contacted with an etching composition as described herein by any method known in the art, for example, by immersing, brushing, spraying, dipping, combinations thereof, and the like. Some embodiments use a high pressure jet of the etching composition onto the surface to be cleaned. As noted above, the etch rate of aluminum oxide generally increases with the base concentration. Higher temperatures also increase the etch rate. Suitable temperatures include from about 0° C. to about 100° C., preferably, from about 20° C. to about 90° C., more preferably, from about 50° C. to about 80° C. In some embodiments, etch rates of aluminum oxide are at least about 2 µm/hr, preferably, at least about 8 µm/hr, more preferably, at least about 17 µm/hr. In some embodiments, the underlying titanium surface is oxidized at less than about 1 µm/hr, preferably, less than about 0.3 µm/hr, more preferably, less than about 0.1 µm/hr. Selectivities between aluminum oxide and titanium are at least about 20:1, preferably, at least about 30:1, more preferably, at least about 40:1. The skilled artisan will appreciate that etch selectivity represents the ratio of etch rates for different materials exposed to the etchant.

Etching times will depend on the thickness and nature of the aluminum oxide film(s), as well as the etching rate. As discussed above, film thicknesses can vary on a single component. Because the selectivity of the etching composition is high, in some embodiments, the etching composition may contacted with the surface-to-be-cleaned for much longer than necessary for etching the aluminum oxide without significantly oxidizing the titanium surface. Suitable etching times can be greater than about 1 hr, greater than about 5 hrs, or greater than about 10 hrs, depending upon the metal oxide thickness to be removed.

In some embodiments, the etching is assisted mechanically, for example, by ultrasound and/or by mechanically abrading the surface-to-be-cleaned, for example, using an abrasive pad and/or brush. Fresh etching composition can be replenished at the surface-to-be-cleaned by agitating or circulating the composition, for example, using a stirring device and/or fluid pump.

As discussed above, some embodiments of the etching composition comprise abrasive particles. In these embodiments, mechanical cleaning is initiated by, for example, high pressure washing, ultrasound, agitation, combinations thereof, and the like.

In step 130, the etching is terminated, for example, by rinsing with any suitable agent, for example, with deionized water, distilled water, alcohols, ammonia, organic solvents, combinations thereof, and the like. The inhibitor for selectivity may be chemisorbed on the metal parts and should be removed to restore the natural passivation layer of titanium at the surface and to prevent potential contamination of the reactor, which can impact adhesion of subsequent depositions on the chamber surfaces or contaminate substrates on which the layers are being deposited. Removal of chemisorbed inhibitor (e.g., gallic acid) can be aided by exposure to oxidizing treatments, such as ozonated deionized rinse, plasma treatments, peroxide, monoperoxysulfate or diperoxysulfae or peroxy inorganic oxidants.

In some embodiments, the cleaned surface is further processed, for example, by polishing. The cleaned surface is inspected to assess the effectiveness of the cleaning as well as the condition of the component. Components are refurbished, if necessary, for example, by refacing. Components passing inspection are then requalified, if necessary, and returned to service.

Contacting titanium with a basic etchant in the absence of an inhibitor tends to oxidize the titanium, forming a porous, surface layer of titanium dioxide ($TiO_2$, titania). This layer of titanium dioxide is not self passivating, that is, does not prevent further oxidation of the metal. Consequently, continued exposure to the base etchant results in a thicker layer of titanium dioxide. In addition, the pores tend to grow over time. Contact with hot, concentrated base accelerates the oxidation.

When present on reactor surfaces, this porous oxide layer negatively impacts process throughput and reproducibility. Process gases are retained in the pores in the oxide, increasing purge time because removal of the gases is limited by diffusion. The porous surface also has a larger surface area than a comparable unoxidized titanium surface, increasing the quantity of process gases adsorbed on the surface, thereby increasing the consumption of process gases and processing times. These concerns are especially true for ALD deposition processes. Because titanium dioxide is less dense than titanium, the dimensions of the component will change, which can alter critical dimensions. The titanium dioxide layer is also susceptible to flaking and/or spalling, thereby generating contaminating particles. Even if the oxide layer is removed, the oxidation of the titanium alters the dimensions of the component, changing critical features, thereby reducing the lifetime of the component.

It is believed that the inhibitor, for example, gallic acid, forms a layer on the surface of titanium or titanium alloy that resists oxidation by the etchant.

Similarly, damage to other metal reactor parts can also occur when etching metal oxides from over other metals (e.g., stainless steel, nickel or nickel alloys), without adequate selectivity.

EXAMPLE 1

Effect of Gallic Acid on Etch Rates

FIG. 2 illustrates a test sample 200 comprising a titanium sheet 210 (2.3 cm×2.8 cm×1 mm) and alumina strips 220. Two sets of test samples were formed. One sample of each set had a thick alumina layer (~49 µm), and one had a thin alumina layer (~7 µm). The test samples were cleaned with isopropanol, rinsed with distilled water, and dried with nitrogen before etching. Etching was performed in double-walled beakers in a temperature controlled water bath. One set of test samples was etched in an aqueous solution of 0.5 M KOH at 80° C. for 40 min. The other set of test samples was etched in an aqueous solution of 0.5 M KOH/0.05 M gallic acid/0.05 M sodium tetraborate ($Na_2B_4O_7$) at 80° C. for 40 min. Unless otherwise specified, all reagents were purchased from Aldrich Chemical Co. (Milwaukee, Wis.) and used without purification. After etching, the test samples were rinsed with distilled water and dried in a nitrogen stream. Alumina step heights were measured before and after etching by profilometry (KLA-Tencor, San Jose, Calif.). Results are summarized in TABLE I.

TABLE I

| Etchant | Height pre etch (μm) | Height post etch (μm) | Difference (μm) |
|---|---|---|---|
| KOH | 48.9 | 40.3 | 8.6 |
| KOH | 7.2 | 0 | 7.2 |
| KOH/gallic acid | 54.4 | 46.5 | 7.9 |
| KOH/gallic acid | 7.4 | 0 | 7.4 |

The etch rate of aluminum oxide in the absence of gallic acid was 12.9 μm/hr, and in the presence of gallic acid was 11.8 μm/hr. Gallic acid did not significantly affect etch rates of aluminum oxide.

EXAMPLE 2

Field Emission Scanning Electron Microscopy

Field emission scanning electron microscopy (FESEM) was performed on the etched test samples from Example 1 to ascertain the effect of etching on the surface morphology. An edge of each sample was polished with 280, then 1200 grit emery paper before imaging. Images were acquired at Area 1 (titanium not covered by $Al_2O_3$ before etching) and Area 2 (titanium covered by $Al_2O_3$ before etching) as illustrated in FIG. 2.

Figure 3A:
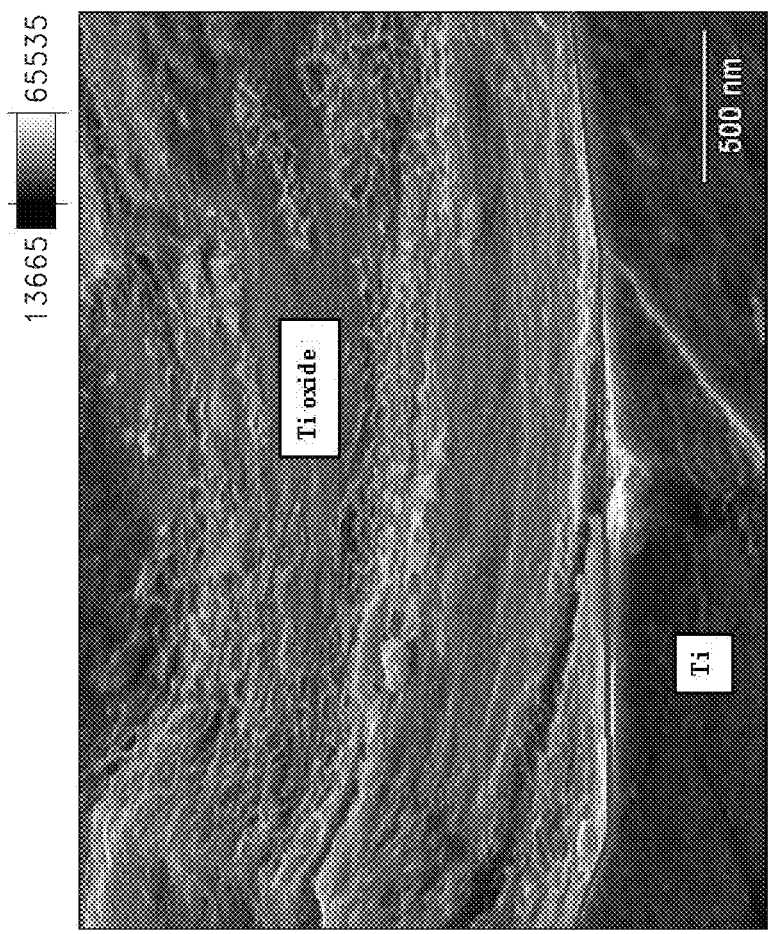
FIG. 3A is a FESEM of area 1 of a test sample etched in the absence of gallic acid.
Figure 3B:
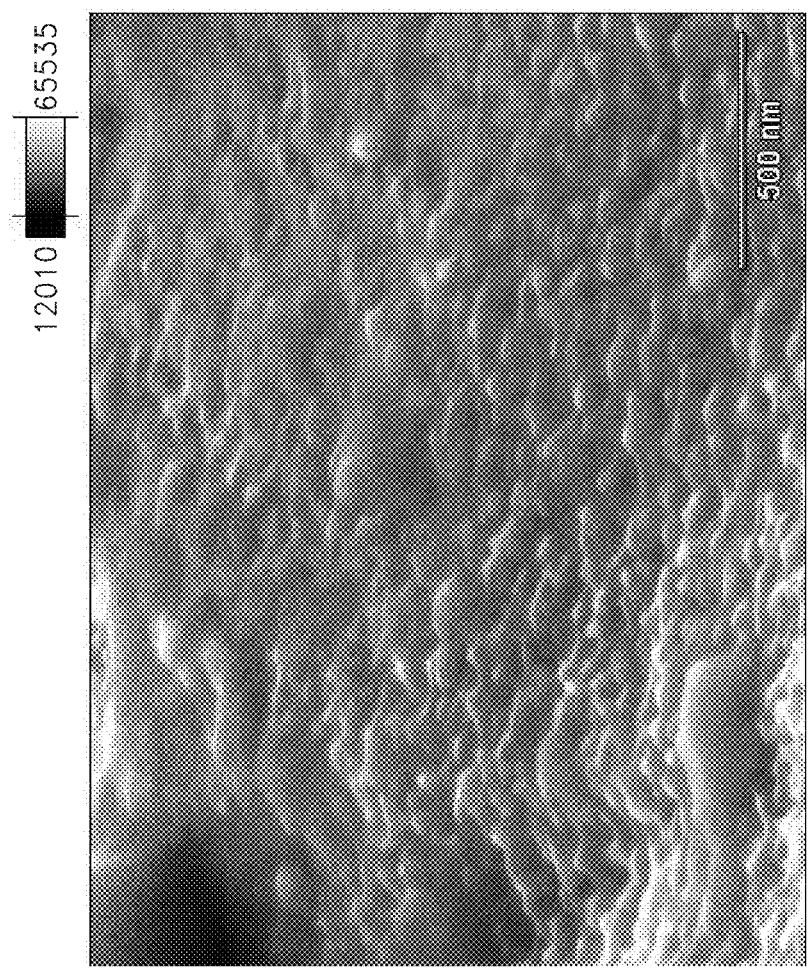
FIG. 3B is a FESEM of area 2 of the same test sample.

FIG. 3A was taken at Area 1 of a sample etched in the absence of gallate. An oxide layer was formed on the surface of the titanium. The oxide layer was very thin and was not visible from the edge. Consequently, the sample was tilted to provide a better view. The edge between the top and side of the sample is indicated by the dark line. With an exposure of only 40 minutes, the oxide layer is thin and not continuous. Accelerating voltage was 5 kV; magnification: 40,000×. FIG. 3B was taken at Area 2 of the same sample. The titanium surface exposed by the etching showed a series of bumps, indicating etching of the underlying titanium after removal of the alumina in this area. Accelerating voltage: was 5 kV; magnification: 60,000×.

Figure 4A:
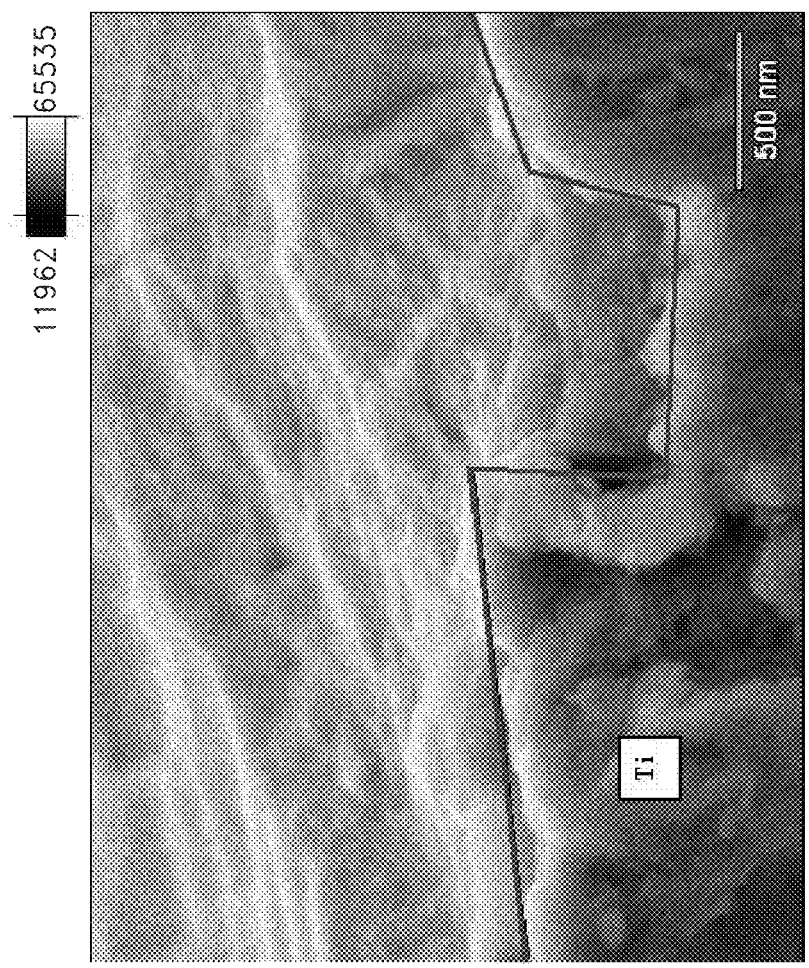
FIG. 4A is a FESEM of area 1 of a test sample etched in the presence of gallic acid.
Figure 4B:
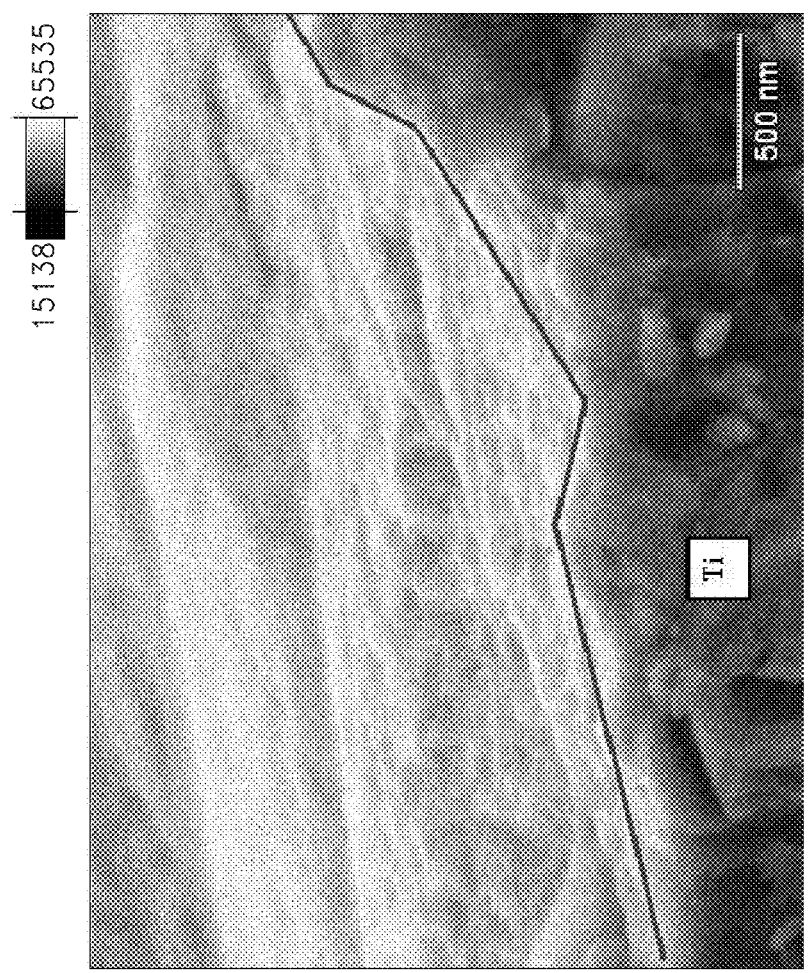
FIG. 4B is a FESEM of area 2 of the same test sample.

FIG. 4A was taken at Area 1 of a sample etched in the presence of gallate. A film formed on the surface of the sample that does not appear to be porous titanium dioxide. Accelerating voltage was 5 kV; magnification: 40,000×. FIG. 4B was taken at Area 2 of the same sample. A film formed on the surface of the titanium appears similar to the film in FIG. 4A, which does not appear to be porous titanium dioxide. Accelerating voltage was 5 kV, magnification: 60,000×.

Titanium oxide formed on samples etched absent gallate. Non-porous surfaces were left on samples etched in the presence of gallate. Thus, gallic acid inhibits porous layer formation but does not influence the etch rate of alumina in KOH solution.

EXAMPLE 3

Characterization of Titanium Surface after Etching

Test samples with 7 μm thick aluminum oxide layers were prepared as described in Example 1 and etched in a 0.5 M KOH, 0.05 M gallic acid, 0.05 M $Na_2B_4O_7$ etching solution at 80° C. for 1 hr. The sample was rinsed with distilled water and edge-polished as described in Example 2. Profilometry indicated complete etching of the aluminum oxide.

Figure 5A:
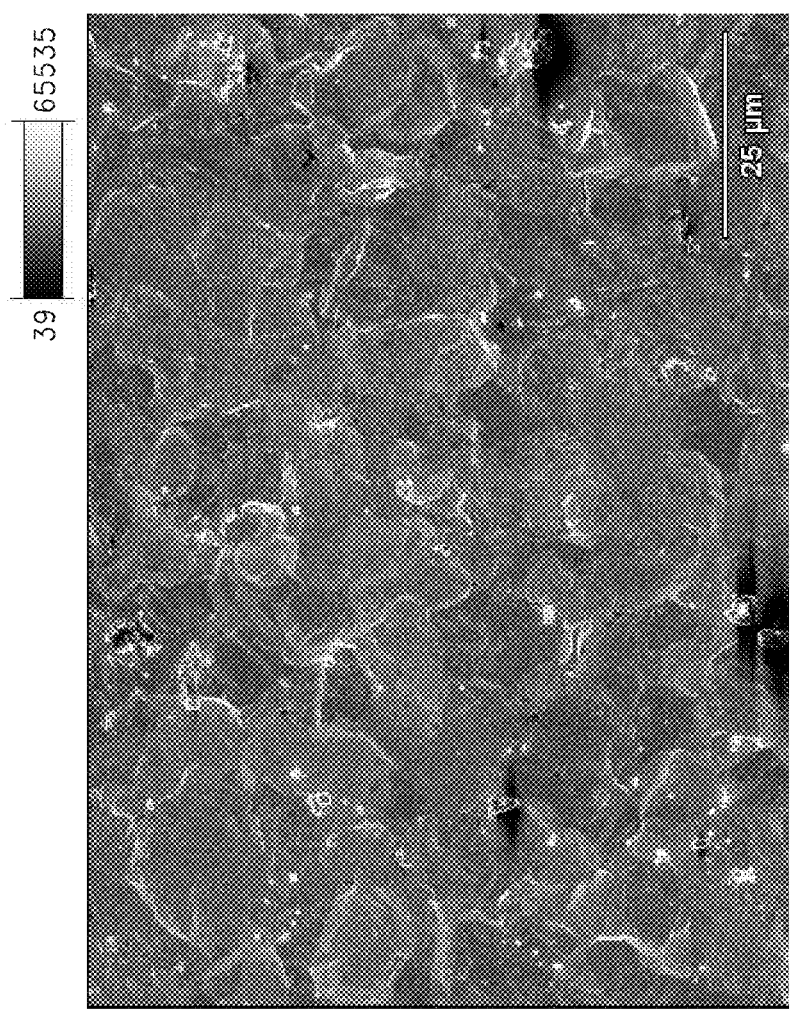
FIGS. 5A and 5B are FESEM images of a planar face of a test sample etched in the presence of gallic acid.
Figure 5B:
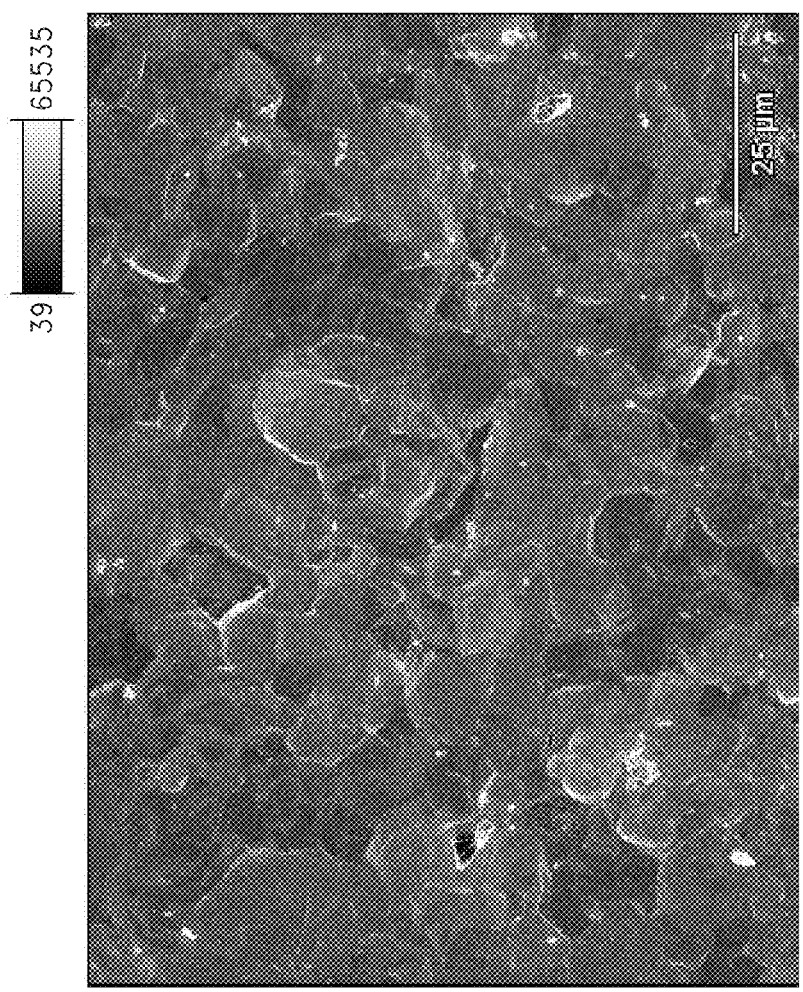

FESEM images of the planar face of the etched area formerly under the aluminum oxide are provided in FIGS. 5A and 5B. Accelerating Voltage was 5.0 kV; magnification: 1000×.

Figure 6:
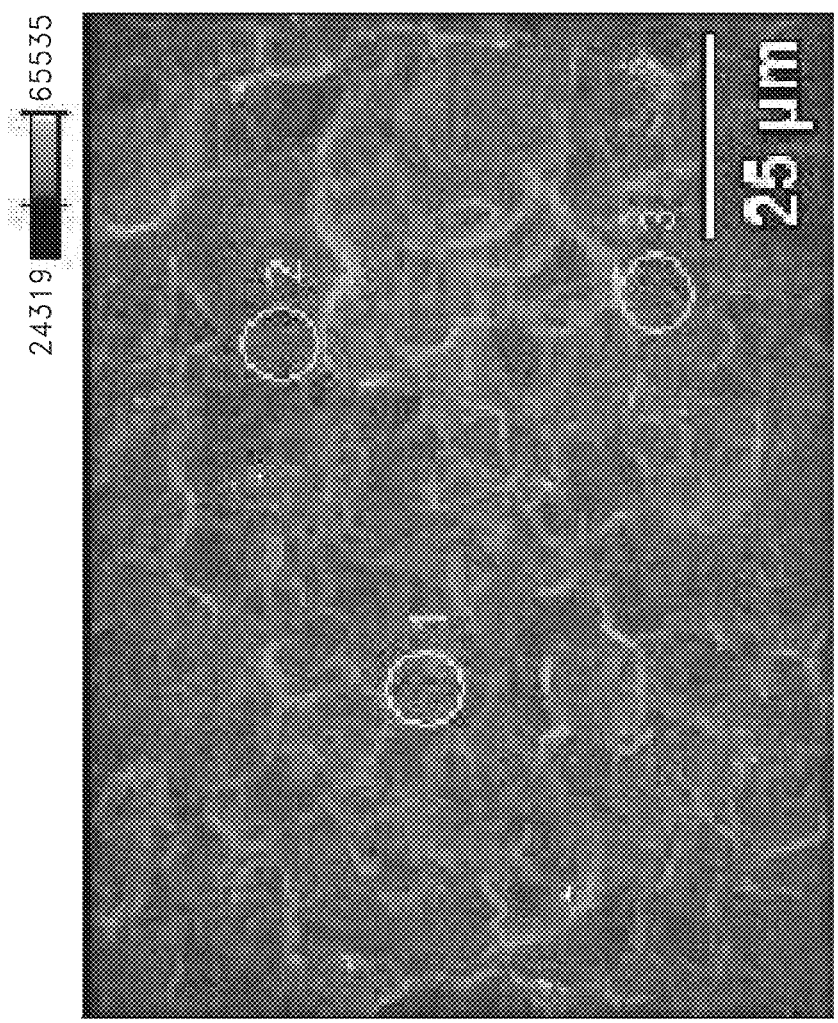
FIG. 6 is an FESEM image of a planar face of a test sample etched in the presence of gallic acid identifying areas at which EDS was performed.
Figure 7A:
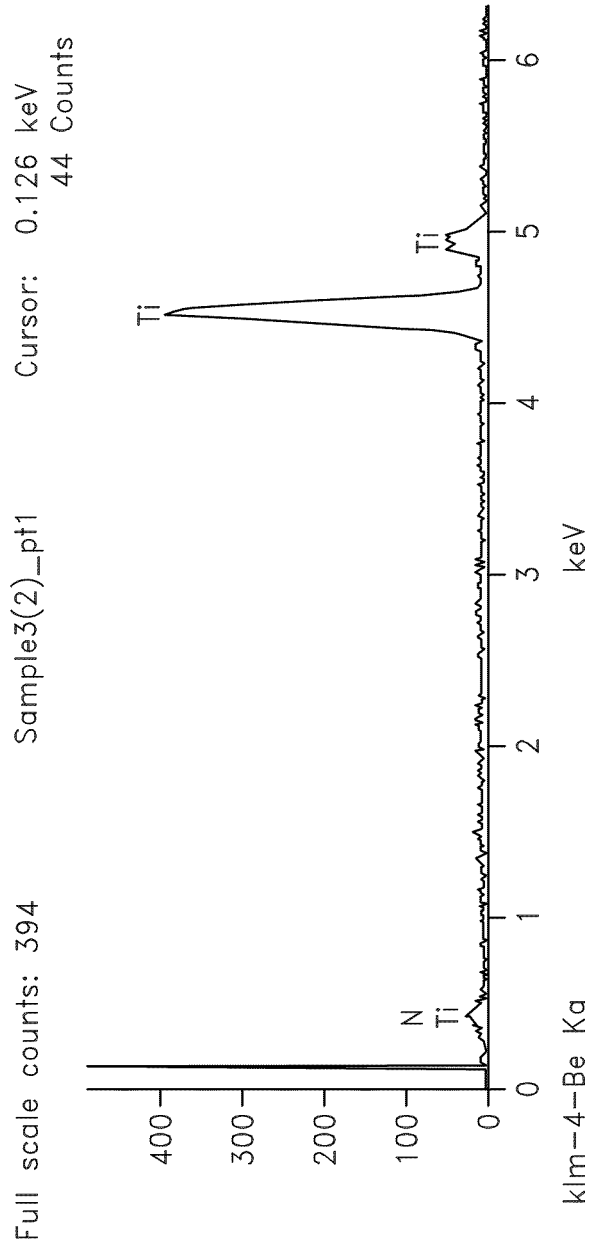
FIGS. 7A-7C are EDS spectra of the areas identified in FIG. 6.
Figure 7B:
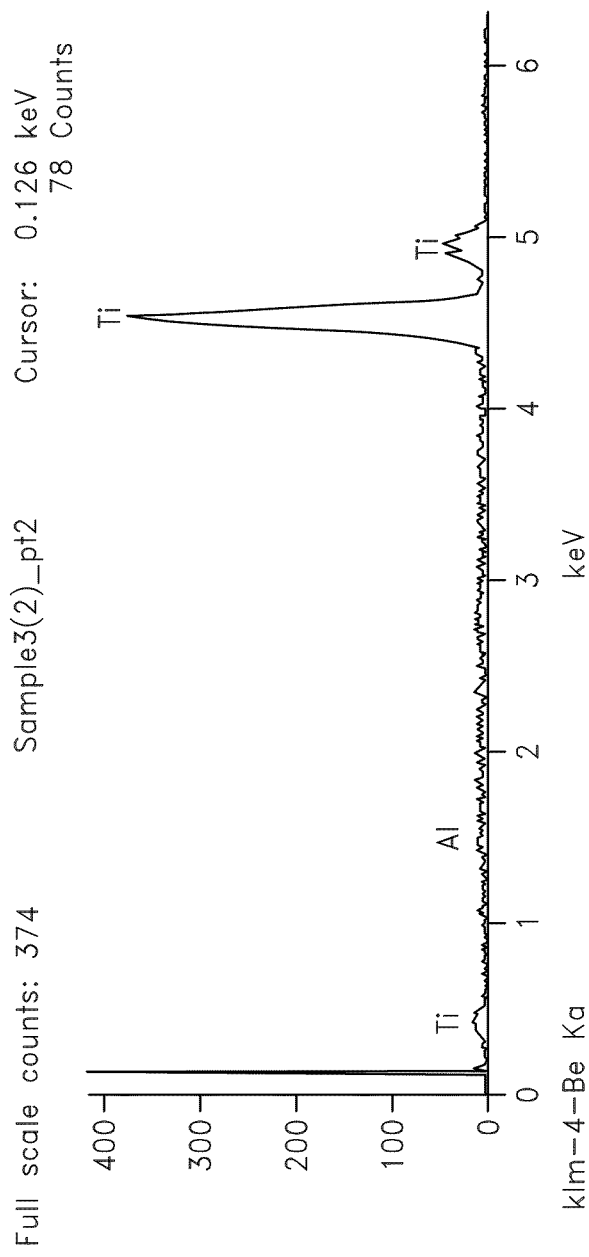
Figure 7C:
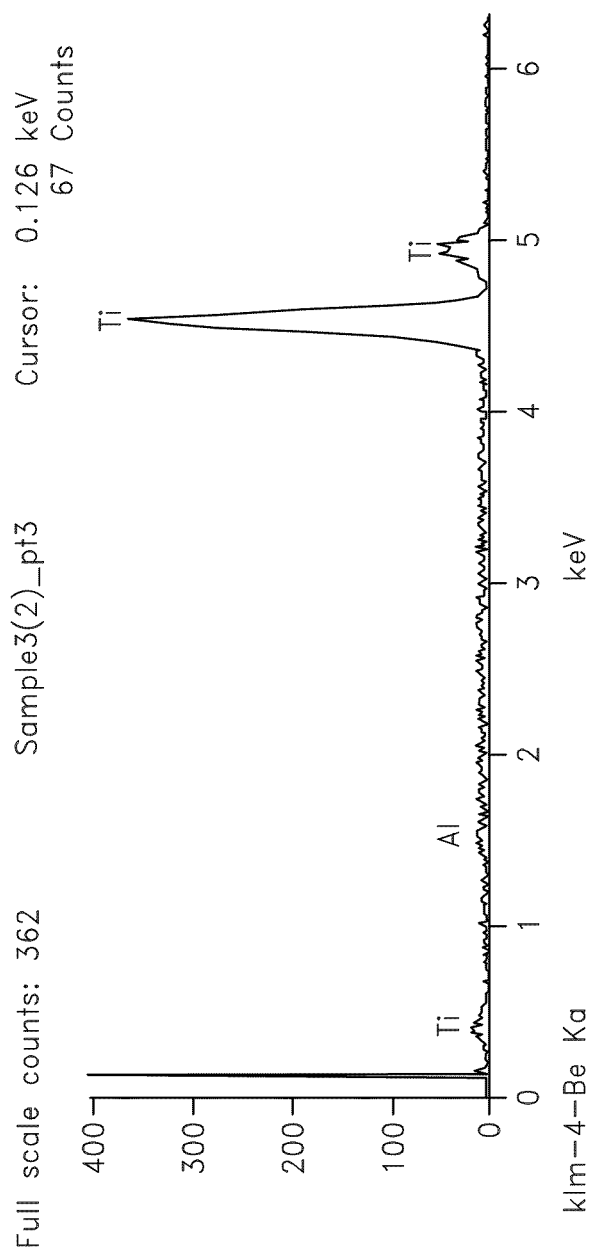

Energy dispersive spectroscopy (EDS) X-ray microanalysis was also performed at three locations formerly covered by aluminum oxide, designated as 1, 2, and 3 in FIG. 6, with the corresponding EDS spectra illustrated in FIGS. 7A-7C, respectively. These spectra reveal substantially no aluminum remained on the sample indicating that the etching completely removed the aluminum oxide layer.

EXAMPLE 4

Aluminum Oxide Etch Rates

Figure 8A:
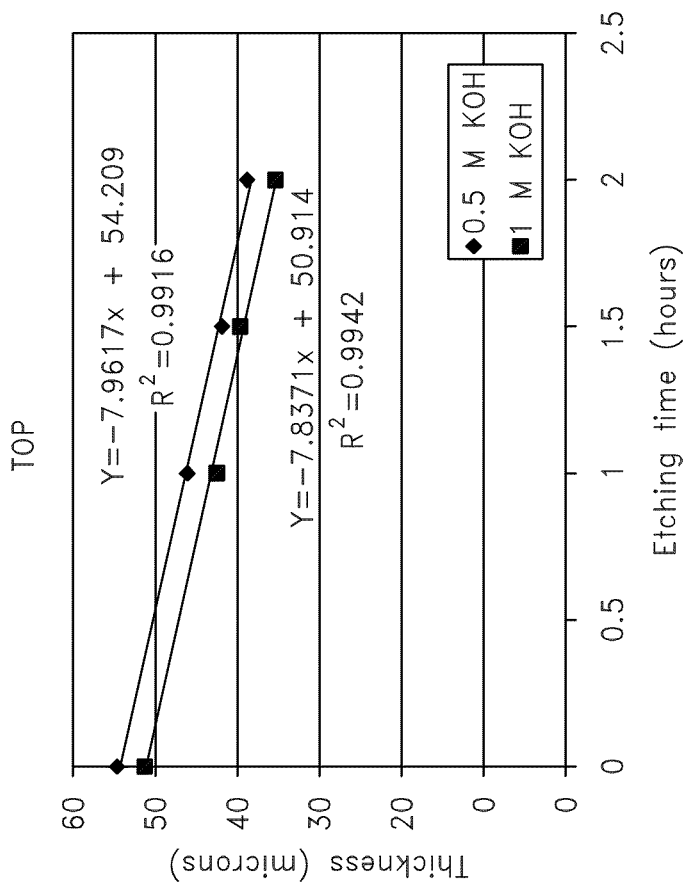
FIGS. 8A and 8B graphically illustrate aluminum oxide etching rates for different etchant concentrations.
Figure 8B:
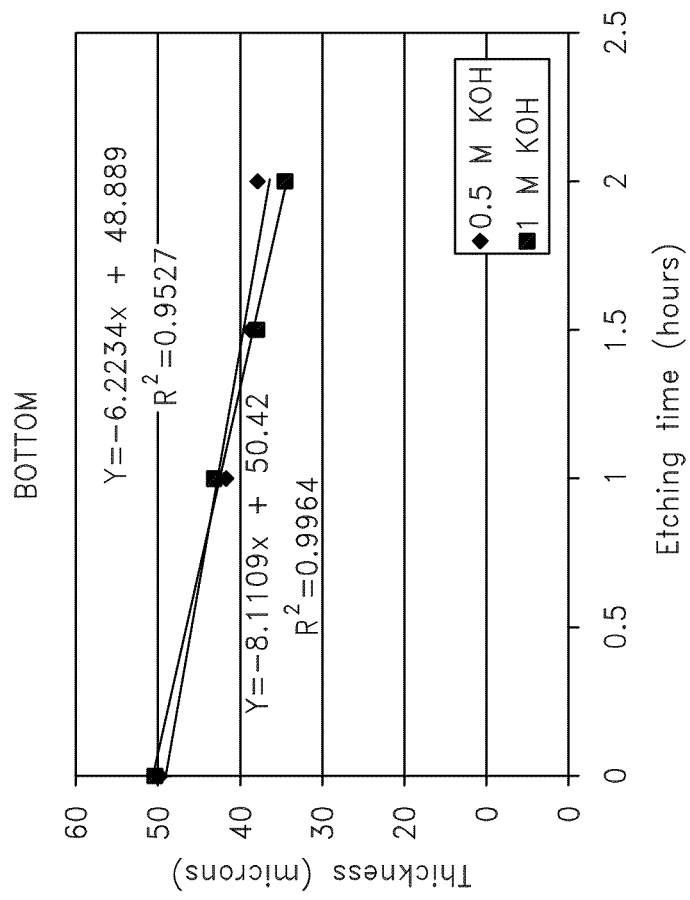

Two test samples were prepared and etched as described in Example 1. Etching was performed at 65° C. One experiment used 0.5 M KOH in the etching composition and the other used 1 M KOH. The thickness of the aluminum oxide layers on the top and bottom of the sample was monitored by profilometry. Results are tabulated in TABLE II and illustrated graphically in FIGS. 8A and 8B. Etching rates were similar for both concentrations of KOH in these experiments.

TABLE II

| Time | 0.5M KOH | | 1M KOH | |
|---|---|---|---|---|
| (hour) | Top (μm) | Bottom (μm) | Top (μm) | Bottom (μm) |
| 0 | 54.60 | 49.60 | 51.13 | 50.25 |
| 1 | 45.75 | 41.82 | 42.39 | 42.86 |
| 1.5 | 41.70 | 38.40 | 39.67 | 37.83 |
| 2 | 38.96 | 37.73 | 35.20 | 34.24 |

Figure 9:
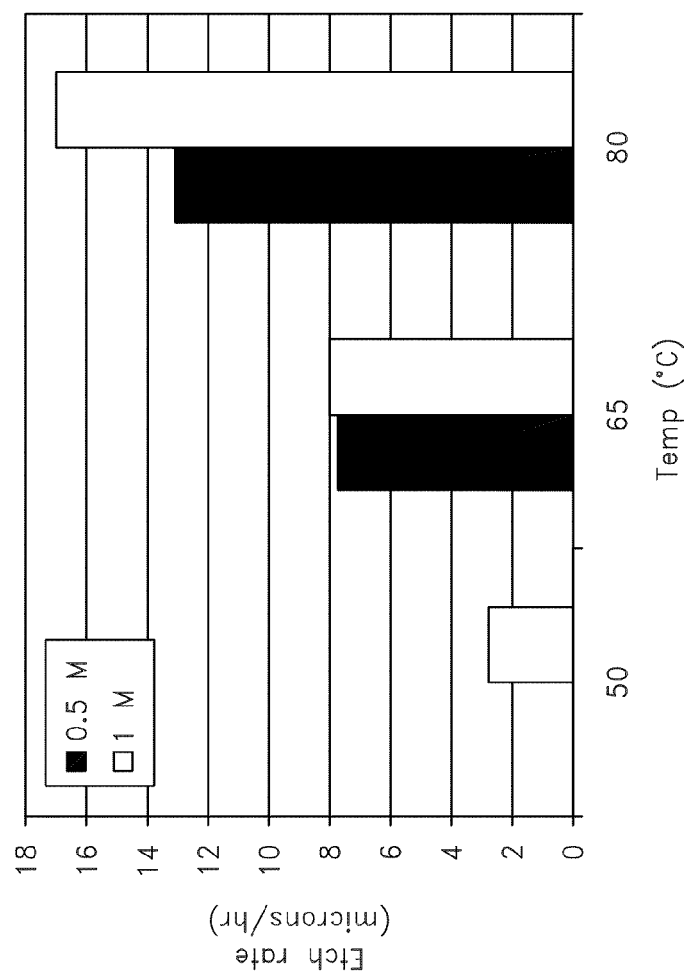
FIG. 9 graphically illustrates aluminum oxide etching rates for different etchant concentrations and temperatures.

In another set of experiments, etching rates were measured for 0.5 M and 1 M KOH at 50° C., 65° C., and 80° C. Results are tabulated in TABLE III and illustrated in FIG. 9.

TABLE III

| Temperature | Etch Rate in 0.5M KOH (μm/hr) | Etch Rate in 1M KOH (μm/hr) |
|---|---|---|
| 50 | — | 2.8 |
| 65 | 7.7 | 8.0 |
| 80 | 13 | 17 |

These results indicate that higher etch rates can be obtained at higher KOH concentrations and higher temperatures.

EXAMPLE 5

Effect of Hydroxide on Titanium

Titanium samples were cleaned by rinsing with distilled water, isopropanol, and distilled water; sonicating in distilled water; rinsing with distilled water, isopropanol, and distilled water; soaking in 10% $HNO_3$ for 1 min; and rinsing in distilled water. Samples were then etched in 0.5 M KOH (no gallate) for 2 hr or 4 hr as described in Example 1, then rinsed within distilled water and dried with nitrogen. An edge was polished as described in Example 2 for FESEM analysis.

Figure 10A:
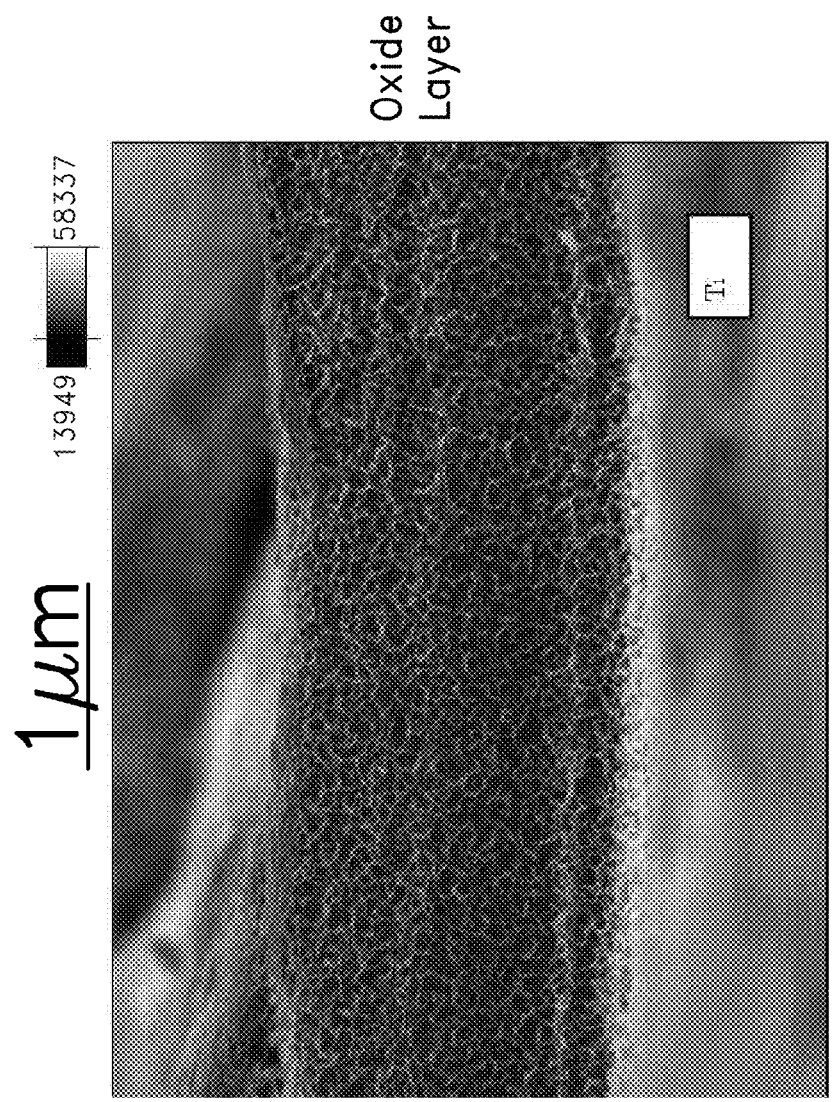
FIGS. 10A-10C are FESEM images of a test sample etched in the absence of gallic acid.

FIG. 10A is an FESEM image of an edge of a sample etched for 2 hr showing a layer of titanium dioxide about 3

μm thick and the underlying titanium. The titanium dioxide layer has a porous honeycomb structure. Titanium dioxide was formed at about 1.5 μm/hr (250 Å/min). Accelerating voltage was 5 kV, magnification: 20,000×.

Figure 10B:
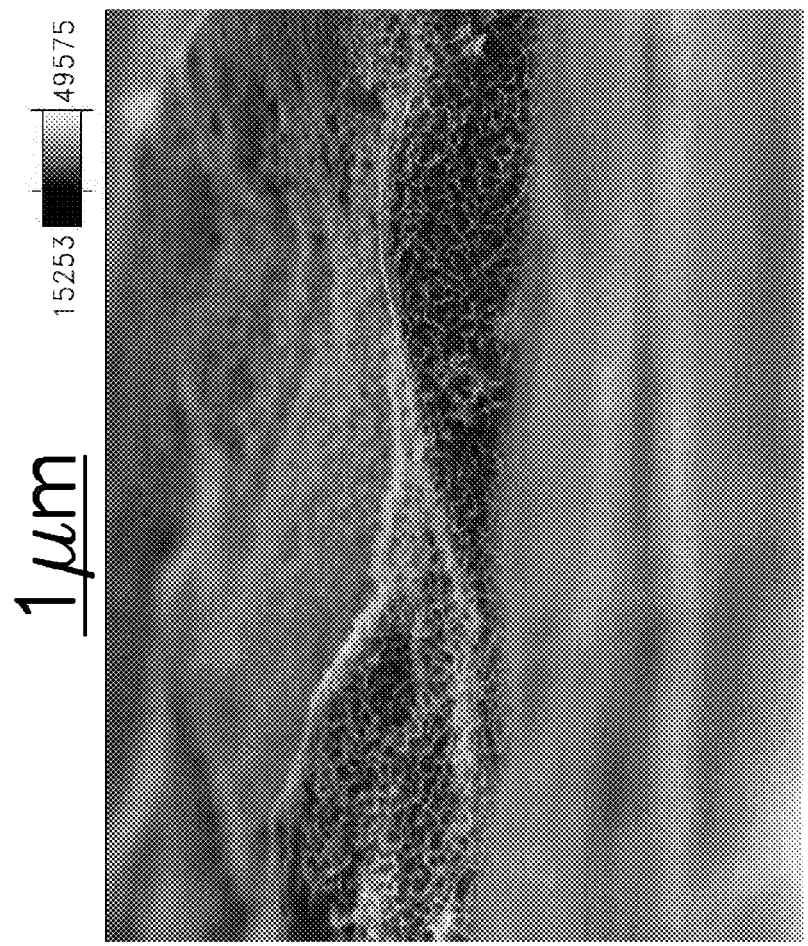

FIG. 10B is an FESEM image of an edge of another sample etched for 2 hr. In this sample, the thickness of titanium oxide layer is not uniform, but ranges from about 1 μm to about 3 μm. Again, the structure is a porous honeycomb. Accelerating voltage was 5 kV; magnification: 20,000×.

Figure 10C:
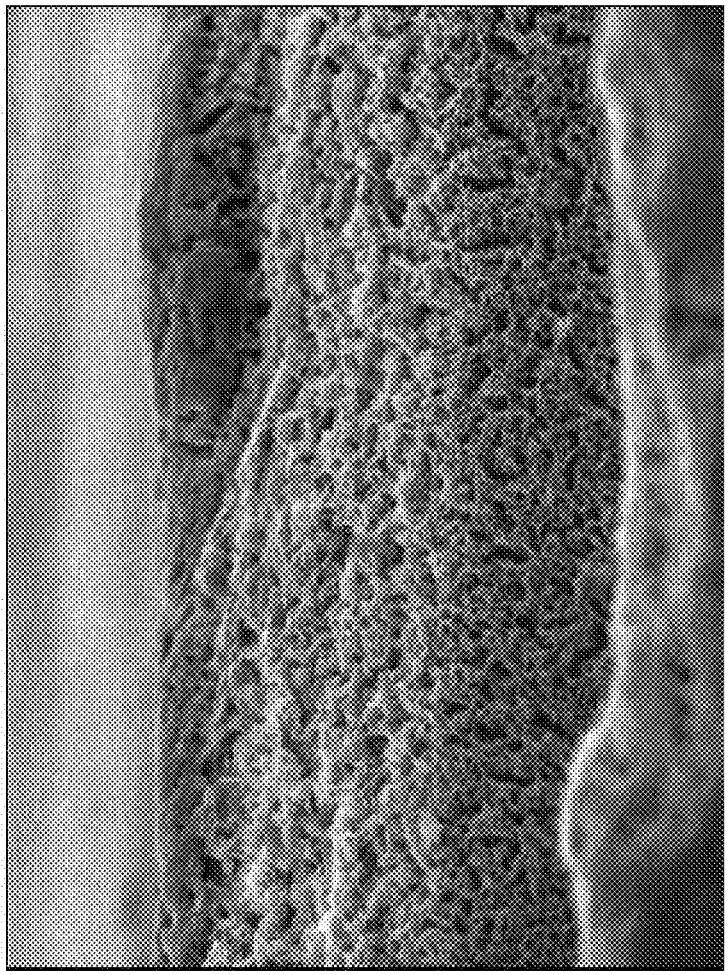

FIG. 10C is an FESEM image of an edge of a sample etched for 4 hr. In this sample, the thickness of titanium oxide layer is from about 5 μm to about 6 μm. The pores in this sample appear to be larger than the pores of the 2 hr samples. Accelerating voltage was 5 kV, magnification: 15,000×.

EXAMPLE 6

Effect of Hydroxide with Gallate on Titanium

Figure 11:
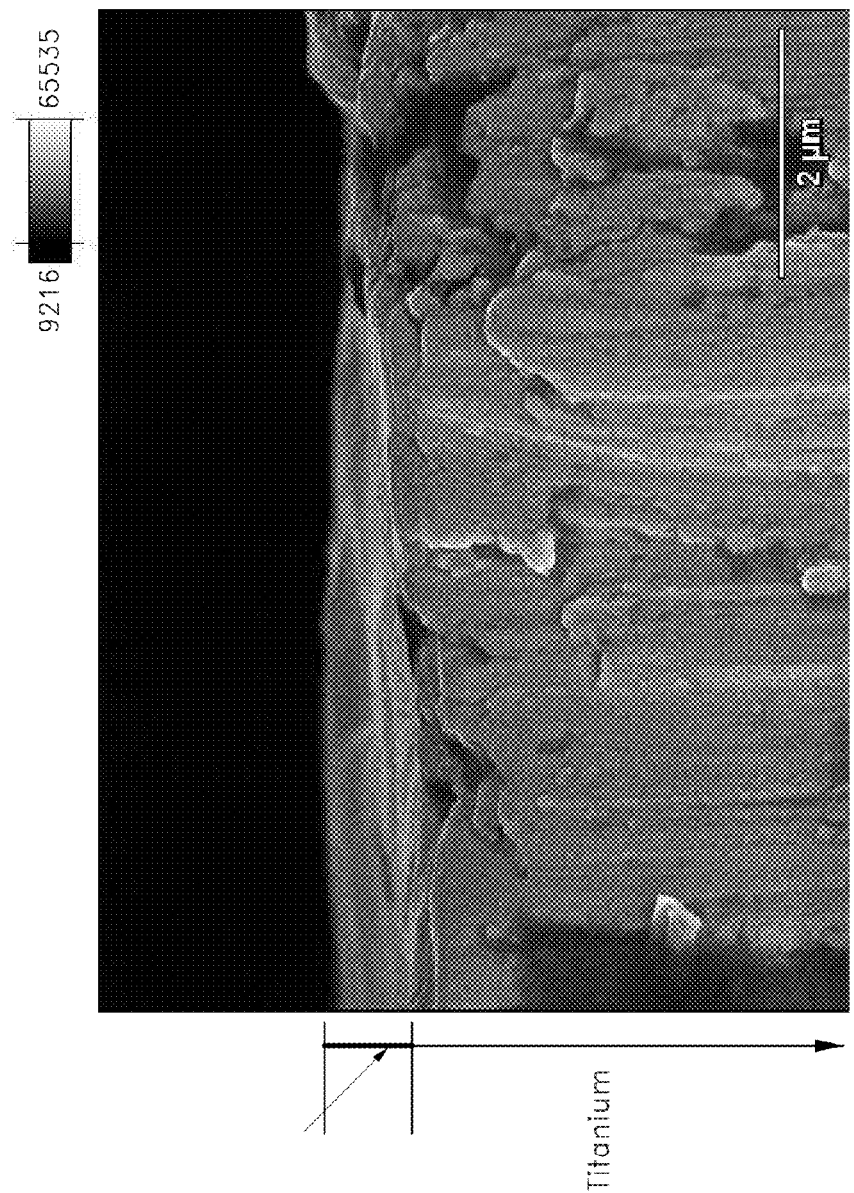
FIG. 11 is an FESEM image of a test sample etched in the presence of gallic acid.

Titanium samples were cleaned and etched as described in Example 5 using 0.5M KOH, 0.05 M gallic acid, 0.05 M $Na_2B_4O_7$ at 80° C. for 1 hr, then rinsed, dried, and edge polished. FIG. 11 is an FESEM image of an edge of a sample showing a surface layer and underlying titanium. The surface layer is relatively thinner and smoother than the oxide layers of Example 5. The surface layer is also not porous. This layer is believed to be a gallic acid or gallate layer, which protects the underlying titanium layer from chemical attack.

The embodiments illustrated and described above are provided only as examples of certain preferred embodiments. Various changes and modifications can be made to the embodiments presented herein by those skilled in the art without departure from the spirit and scope of the disclosure, which is limited only by the appended claims.

We claim:

1. A method for selectively etching metal oxide from a metal part of a semiconductor reactor, the method comprising;
    contacting a surface of the metal part with an alkaline etchant, the metal part is made of titanium, wherein
    a metal oxide is present on the surface of the metal part, the metal oxide comprising at least one of hafnium oxide, zirconium oxide, and aluminum oxide, the alkaline etchant comprises an alkali metal hydroxide and is effective for etching the metal oxide, and
    the metal part is susceptible to chemical attack by the alkaline etchant; contacting the surface of the metal part with an inhibitor effective for inhibiting chemical attack of the metal part by the alkaline etchant.

2. The method of claim 1, wherein the metal oxide comprises at least one of hafnium oxide and zirconium oxide.

3. The method of claim 1, wherein the alkali metal hydroxide comprises at least one of sodium hydroxide and potassium hydroxide.

4. The method of claim 1, wherein the inhibitor comprises a polyhydroxy benzene compound.

5. The method of claim 4, wherein the inhibitor comprises gallic acid.

6. The method of claim 1, further comprising contacting the surface of the metal substrate with a stabilizer effective to stabilize the inhibitor.

7. The method of claim 6, wherein the stabilizer comprises borate species.

8. The method of claim 1, wherein at least a portion of a contacting step is performed at from about 0° C. to about 100° C.

9. The method of claim 1, wherein the metal oxide is aluminum oxide and contacting the surface of the metal part with the alkaline etchant and the inhibitor comprises etching the aluminum oxide at an etch rate of at least about 2 μm/hr.

10. The method of claim 9, wherein the etch rate of the aluminum oxide is at least about 8 μm/hr.

11. The method of claim 9, wherein contacting the surface of the metal part with the alkaline etchant and the inhibitor comprises etching the metal part at an etch rate of less than 1 μm/hr.

12. The method of claim 1, wherein contacting the surface of the metal part with the alkaline etchant and the inhibitor comprises selectively etching the metal oxide from over the metal part with an etch selectivity of at least 20:1.

13. The method of claim 12, wherein the etch selectivity is at least 30:1.

14. The method of claim 1, wherein the metal part is an internal surface of a component of a chemical vapor deposition or atomic layer deposition reaction chamber used in the deposition of aluminum oxide.

15. The method of claim 1, further comprising removing the inhibitor from the metal part by an oxidizing treatment.

16. A method for ex situ wet cleaning aluminum oxide from a titanium surface of a deposition reactor used for depositing aluminum oxide, the method comprising:
    contacting with an etchant the titanium surface of a deposition reactor on which a layer of aluminum oxide is deposited, wherein the etchant comprises at least one of sodium hydroxide and potassium hydroxide;
    contacting the titanium surface with an inhibitor comprising a polyhydroxy benzene compound; and
    contacting the titanium surface with a stabilizer comprising borate species.

17. The method of claim 16, wherein the inhibitor comprises gallic acid.

* * * * *